United States Patent
Shimada et al.

(10) Patent No.: US 8,858,706 B2
(45) Date of Patent: Oct. 14, 2014

(54) SINGLE-CRYSTAL MANUFACTURING APPARATUS AND SINGLE-CRYSTAL MANUFACTURING METHOD

(75) Inventors: Toshiro Shimada, Nishishirakawa (JP); Kosei Sugawara, Nishishirakawa (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 141 days.

(21) Appl. No.: 13/500,536

(22) PCT Filed: Nov. 9, 2010

(86) PCT No.: PCT/JP2010/006554
§ 371 (c)(1),
(2), (4) Date: Apr. 5, 2012

(87) PCT Pub. No.: WO2011/067894
PCT Pub. Date: Jun. 9, 2011

(65) Prior Publication Data
US 2012/0192786 A1    Aug. 2, 2012

(30) Foreign Application Priority Data
Dec. 4, 2009   (JP) .................................. 2009-276675

(51) Int. Cl.
*C30B 15/14* (2006.01)
*C30B 29/06* (2006.01)
*C30B 15/00* (2006.01)

(52) U.S. Cl.
CPC ............... *C30B 29/06* (2013.01); *C30B 15/14* (2013.01); *C30B 15/00* (2013.01)
USPC ............. 117/13; 117/217; 117/931; 117/208; 117/73

(58) Field of Classification Search
CPC ............................ C30B 15/14; C30B 29/06
USPC ..................................................... 117/13, 217
See application file for complete search history.

(56) References Cited

U.S. PATENT DOCUMENTS 4,400,232 A    8/1983   Ownby et al.
4,791,261 A *  12/1988  Phinney et al. ............... 219/634
(Continued)

FOREIGN PATENT DOCUMENTS

CN    1502727 A    6/2004
JP    A-3-164494   7/1991
(Continued)

OTHER PUBLICATIONS

Dec. 28, 2010 International Search Report issued in International Patent Application No. PCT/JP2010/006554 (with translation).
(Continued)

*Primary Examiner* — Michael Kornakov
*Assistant Examiner* — Hua Qi
(74) *Attorney, Agent, or Firm* — Oliff PLC

(57) ABSTRACT

A single-crystal manufacturing apparatus according to the Czochralski method, including: a crucible that contains a raw material; a main chamber configured to accommodate a heater for heating and melting the raw material; and a pulling chamber configured to pull and accommodate a grown single crystal, the pulling chamber being continuously provided above the main chamber; an inner shield provided between the heater and the main chamber and for insulating heat radiated from the heater, and a supporting member for supporting the inner shield from below. The inner shield is supported at three or more supporting points contacting the supporting member, and a lower end of the inner shield except at the supporting points does not contact the supporting member.

10 Claims, 4 Drawing Sheets

(56) References Cited

U.S. PATENT DOCUMENTS

| | | | | |
|---|---|---|---|---|
| 5,098,675 | A | * | 3/1992 | Matsuo et al. ............... 117/213 |
| 5,989,341 | A | * | 11/1999 | Yasuda et al. ............... 117/216 |
| 2004/0099207 | A1 | | 5/2004 | Nawata et al. |
| 2007/0215038 | A1 | * | 9/2007 | Iida et al. ..................... 117/217 |
| 2008/0053372 | A1 | | 3/2008 | Anttila et al. |

FOREIGN PATENT DOCUMENTS

| | | |
|---|---|---|
| JP | A-6-271385 | 9/1994 |
| JP | A-10-139581 | 5/1998 |
| JP | A-2001-270797 | 10/2001 |
| JP | A-2001-270798 | 10/2001 |
| JP | A-2002-265297 | 9/2002 |

OTHER PUBLICATIONS

Jun. 25, 2013 Notification of Reasons for Refusal issued in Japanese Application No. 2009-276675 with partial English-language translation.

May 26, 2014 The First Office Action issued in Chinese Application No. 201080052894.9 with partial translation.

* cited by examiner

SINGLE-CRYSTAL MANUFACTURING APPARATUS AND SINGLE-CRYSTAL MANUFACTURING METHOD

TECHNICAL FIELD

The present invention relates to a single-crystal manufacturing apparatus and a single-crystal manufacturing method according to the Czochralski method (hereinafter referred to as the CZ method).

BACKGROUND ART

In recent years, as substrates for use in fabrication of very highly integrated semiconductor devices, mirror-polished silicon wafers that are produced from silicon single crystals grown according to the CZ method are mainly used.

FIG. 5 shows a schematic view of an example of a conventional single-crystal manufacturing apparatus according to the CZ method.

As shown in FIG. 5, in the single-crystal manufacturing apparatus 101 for use in manufacture of a silicon single crystal according to the CZ method, crucibles 109 and 110 that contain a raw material melt 106 and are movable upwardly and downwardly, and a heater 111 that is provided so as to surround the crucibles 109 and 110 are generally provided in the interior of a main chamber 105 in which a single crystal 108 is grown. A pulling chamber 107 for accommodating and taking out the grown single crystal 108 is continuously provided above the main chamber 105.

For the purpose of discharging oxide generated inside a furnace to the exterior of the furnace etc., an inert gas, such as an argon gas, is introduced from a gas inlet 116 provided at the upper portion of the pulling chamber 107, is flow-guided so as to flow near the single crystal 108 by a graphite gas flow-guide cylinder 104, and is discharged from a gas outlet 117. A heat insulator 112 for preventing heat conduction from the heater 111 to the main chamber 105 is provided outside the heater 111 so as to surround the heater. A cylindrical inner shield 102 for insulating heat radiated from the heater 111 and particles generated from the heat insulator 112 is provided inside the heat insulator 112.

The above single-crystal manufacturing apparatus including the heat insulator 112 provided outside the inner shield 102 is disclosed in Patent Document 1, for example. An inner shield in which a thin carbon fiber reinforced-carbon material is detachably attached on about two-thirds of its inner surface from the bottom is disclosed in Patent Document 2.

In the single-crystal manufacturing apparatus 101, a heat-insulating ring 119 for preventing the gas flow-guide cylinder 104 and the single crystal 108 from being directly exposed to heat radiated from the heater 111 and the raw material melt 106 is also provided.

When the single crystal 108 is grown, a seed crystal 113 attached to a seed holder 114 is dipped in the raw material melt 106, and then a wire 115 is gently wound up while the seed crystal 113 is rotated in a desired direction with a pulling mechanism (not shown) to grow the single crystal 108 at the end portion of the seed crystal 113. To obtain a desired diameter and crystal quality, the crucibles 109 and 110 are moved upwardly to compensate lowering the melt surface due to reduction in the raw material as the crystal is grown so that the melt surface is always held at a constant height.

CITATION LIST

Patent Literature

Patent Document 1: Japanese Unexamined Patent publication (Kokai) No. H10-139581

Patent Document 2: Japanese Unexamined Patent publication (Kokai) No. 2002-265297

SUMMARY OF INVENTION

In the above single-crystal manufacturing apparatus, graphite and the like, having high emissivity, is used as the material of the inner shield 102. As shown in FIG. 6, the inner shield 102 is provided such that its entire lower end surface contacts a concentrically cylindrical supporting member 103 that supports the inner shield.

However, graphite has high thermal conductivity. Therefore, from the inner shield 102 that has been heated to a high temperature by being directly exposed to the heat radiated from the heater 111, heat escapes into the supporting member 103 supporting the inner shield 102 due to heat conduction. A heat retaining effect thereby decreases. The conventional single-crystal manufacturing apparatus thus does not operate with good thermal efficiency, thereby increasing cost in industrial use. This may cause increases in manufacturing time.

The present invention was accomplished in view of the above-described problem, and its object is to provide a single-crystal manufacturing apparatus that can improve a heat retaining property in its furnace structure, save electric power, and reduce single-crystal manufacturing time by inhibiting heat transfer from the inner shield to the supporting member.

To achieve this object, the present invention provides a single-crystal manufacturing apparatus according to the Czochralski method, including: a crucible that contains a raw material; a main chamber that accommodates a heater for heating and melting the raw material; and a pulling chamber configured to pull and accommodate a grown single crystal, the pulling chamber continuously provided above the main chamber; the single-crystal manufacturing apparatus comprising an inner shield for insulating heat radiated from the heater, the inner shield provided between the heater and the main chamber, and a supporting member for supporting the inner shield from below, wherein the inner shield is supported at three or more supporting points contacting the supporting member, and a lower end of the inner shield except at the supporting points does not contact the supporting member.

In the single-crystal manufacturing apparatus including the inner shield for insulating heat radiated from the heater, provided between the heater and the main chamber; and the supporting member for supporting the inner shield from below; in which the inner shield is supported at three or more supporting points contacting the supporting member and a lower end of the inner shield except at the supporting points does not contact the supporting member, the heat transfer area from the inner shield to the supporting member is reduced so that the heat transfer from the inner shield to the supporting member can be inhibited and the heat retaining property in its furnace structure can be improved. As a result, the single-crystal manufacturing apparatus can save electric power, and reduce the melting time of the raw material and the single-crystal manufacturing time.

In the single-crystal manufacturing apparatus, it is preferable that the inner shield contacts the supporting member through rod-shaped members, and a sum of cross-sectional areas of the rod-shaped members is 200 cm$^2$ or less.

When the inner shield contacts the supporting member through the rod-shaped members, the heat transfer from the inner shield to the supporting member is dominantly affected by the cross-sectional areas of the rod-shaped members. When the sum of cross-sectional areas of the rod-shaped members is 200 cm² or less, the heat transfer from the inner shield to the supporting member can be inhibited more surely.

Moreover, the rod-shaped members may be made of carbon material or carbon composite material.

The rod-shaped members made of carbon material or carbon composite material has sufficiently high strength at supporting points at which the inner shield is supported, and the cross-sectional areas of the rod-shaped members can be designed to be smaller.

It is also possible that the rod-shaped members each have a step that forms a narrow end portion, and the narrow end portions are placed on the supporting member.

In the single-crystal manufacturing apparatus including the rod-shaped members each having the step that forms the narrow end portion being placed on the supporting member, when the rod-shaped members placed on the supporting member and inner shield move horizontally, the amount of the movement can be limited by the step with a simple structure. Electric discharge that may be caused by reduction in the distance between the inner shield and the heater can be consequently avoided. In addition, even when the diameter precision of the inner shield is low, positioning of the step enables positional variations due to the movement to be limited within a constant range.

The single-crystal manufacturing apparatus preferably includes a heat insulator surrounding the inner shield.

The single-crystal manufacturing apparatus including the heat insulator surrounding the inner shield can further improve the heat retaining property in its furnace structure and more effectively save electric power.

Furthermore, the present invention provides a single-crystal manufacturing method for a manufacturing a single crystal by using the single-crystal manufacturing apparatus of the present invention.

When a single crystal is manufactured by using the single-crystal manufacturing apparatus of the present invention, the single crystal can be grown thermally efficiently, the manufacturing cost can be reduced by power consumption reduction, and the manufacturing time can be reduced by the reduction in the raw material melting time.

In the single-crystal manufacturing apparatus of the present invention as described above, the inner shield provided between the heater and the main chamber, for insulating heat radiated from the heater and the supporting member for supporting the inner shield from below are provided. Moreover, the inner shield is supported at three or more supporting points contacting the supporting member, and the lower end of the inner shield except at the supporting points does not contact the supporting member. Therefore, the heat transfer area from the inner shield to the supporting member is reduced so that the heat transfer from the inner shield to the supporting member can be inhibited, and the heat retaining property in its furnace structure can be improved. As a result, the single-crystal manufacturing apparatus can save electric power, and reduce the raw material melting time and the single-crystal manufacturing time, thereby improving productivity.

DESCRIPTION OF EMBODIMENTS

Hereinafter, embodiments of the present invention will be described, but the present invention is not limited to these embodiments.

In the conventional single-crystal manufacturing apparatus, an inner shield made of high emissivity material such as graphite is used and the inner shield is disposed such that its entire lower end surface contacts the supporting member that supports the inner shield. Such a graphite inner shield has high thermal conductivity. Therefore, from the inner shield that has been heated to a high temperature by being directly exposed to the heat radiated from the heater, heat escapes into the supporting member due to heat conduction, and the heat retaining effect thereby decreases. The conventional single-crystal manufacturing apparatus thus does not operate with good thermal efficiency, thereby increasing cost in industrial use. This may cause increases in manufacturing time.

In view of these, the present inventors repeatedly and keenly conducted studies to solve the problem. As a result, the present inventors found that the heat transfer from the inner shield to the supporting member can be inhibited by supporting the inner shield with a small heat transfer area from the inner shield to the supporting member. The present inventors also found that bringing the inner shield into contact with the supporting member through carbon or carbon composite rod-shaped members enables enhancement of the supporting point strength and smaller cross-sectional areas of the rod-shaped members, thereby bringing the present invention to completion.

Figure 1:
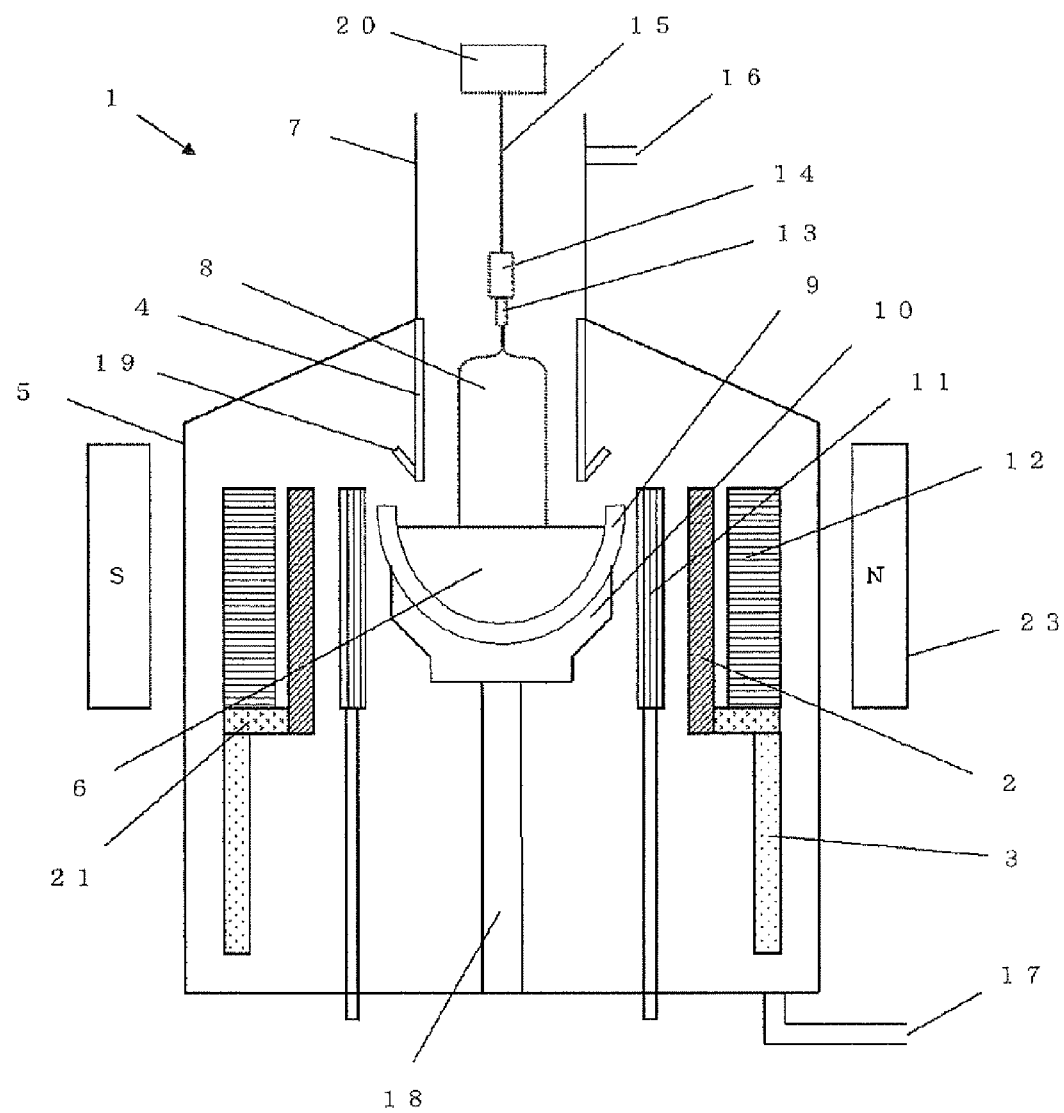
FIG. 1 is a schematic view showing an exemplary single-crystal manufacturing apparatus of the present invention.

FIG. 1 is a schematic view showing an exemplary single-crystal manufacturing apparatus of the present invention.

In the single-crystal manufacturing apparatus 1, as shown in FIG. 1, the crucibles 9 and 10 that contain a raw material, the heater 11 for heating and melting a raw material to obtain the raw material melt 6, and the like are accommodated in the main chamber 5. A pulling mechanism 20 for pulling a grown single crystal 8 while rotating the crystal is mounted on an upper portion of the pulling chamber 7 continuously provided above the main chamber 5.

A wire 15 is reeled off from the pulling mechanism 20 mounted on the upper portion of the pulling chamber 7, and a seed holder 14 for attaching a seed crystal 13 is connected at the end of the wire. The single crystal 8 is formed below the seed crystal 13 by dipping the seed crystal 13 attached at the end of the seed holder 14 in the raw material melt 6 and by winding up the wire 15 with the pulling mechanism 20.

The crucibles 9 and 10 are composed of an inside quartz crucible 9 for directly containing the raw material melt 6 and an outside graphite crucible 10 that supports the quartz crucible 9. The crucibles 9 and 10 are supported with a crucible rotating shaft 18 that is rotatable and movable upwardly and downwardly, mounted on the lower portion of the single-crystal manufacturing apparatus 1. With a mechanism that rotates, raises, and lowers the crucibles (not shown), the crucibles 9 and 10 are moved upwardly for a distance corresponding to the amount of decrease in the melt as the single crystal 8 is pulled, while the crucibles 9 and 10 are rotated in a direction opposite to the crystal rotation direction, so that the melt surface is held at a constant height in order to prevent a crystal diameter and crystal quality from being affected by variations in the melt surface in the single-crystal manufacturing apparatus 1.

A cylindrical gas flow-guide cylinder 4 is provided so as to surround the grown single crystal 8.

Here, graphite is used as the material of the gas flow-guide cylinder 4, and the single crystal 8 can be insulated from the heat radiated from the heater 11 and the raw material melt 6.

For the purpose of discharging oxide generated inside the furnace to the exterior of the furnace, an inert gas, such as an argon gas, is introduced from a gas inlet 16 provided at an upper portion of the pulling chamber 7, and passes through the interior of the gas flow-guide cylinder 4. It is then flow-guided so as to flow near the single crystal 8 during pulling, passes the surface of the raw material melt 6, passes above the upper end edges of the crucibles 9 and 10, and is discharged from a gas outlet 17. This enables cooling the single crystal 8 by the gas during pulling and also preventing oxide deposition on the inside wall of the gas flow-guide cylinder 4, the upper end edges of the crucibles 9 and 10, etc.

A heat-insulating ring 19 that extends upwardly and outwardly from the lower end portion of the gas flow-guide cylinder 4 with its diameter increased gradually toward its top is provided so as to surround the gas flow-guide cylinder 4. The heat-insulating ring 19 can insulate the heat radiated from the heater 11 and the raw material melt 6 and prevent the gas flow-guide cylinder 4 from being directly exposed to the heat.

The main chamber 5 and the pulling chamber 7 are formed out of metal that is excellent in heat resistance and thermal conductivity such as stainless steel, and cooled with water through a cooling pipe (not shown).

The heater 11 is provided so as to surround the crucibles 9 and 10. The inner shield 2 is provided between the heater 11 and the main chamber 5 so as to surround the heater 11. The inner shield 2 can insulate the radiant heat from the heater 11. The inner shield 2 is supported from below by the supporting member 3. The heat insulator 12 is provided outside the inner shield 2 and can prevent heat conduction to the main chamber 5 from the inner shield 2 that has been heated to a high temperature by the heat from the heater. The inner shield 2 can also insulate particles generated from the heat insulator 12. As shown in FIG. 1, the inner shield 2 may be kept at a distance from the heat insulator 12 or contact the heat insulator 12 without a space between them.

Figure 2:
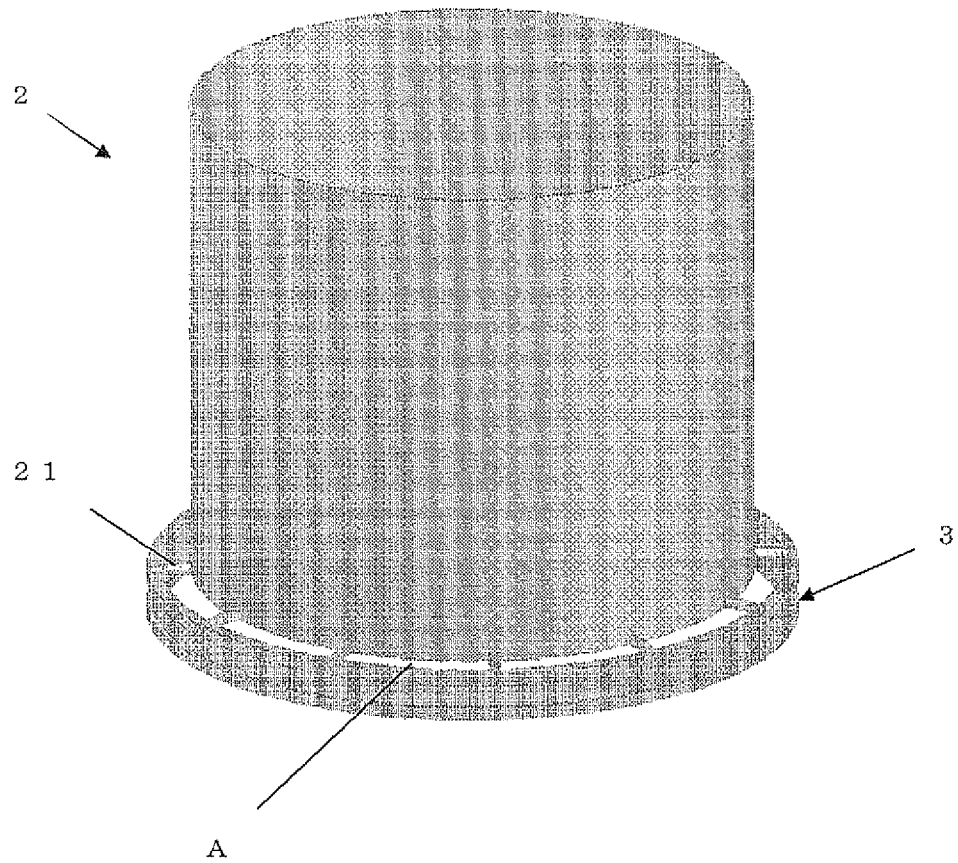
FIG. 2 is a schematic view showing an exemplary inner shield in the single-crystal manufacturing apparatus of the present invention.

A schematic view of an exemplary inner shield 2 is shown in FIG. 2. As shown in FIG. 2, the inner shield 2 is supported at three or more supporting points 21 (the rod-shaped members) contacting the supporting member 3. The lower end of the inner shield 2 except at the supporting points 21 does not contact the supporting member 3 (See 'A' in FIG. 2). When three or more supporting points 21 are provided as described above, the inner shield 2 can be supported in a stable state. A high emissivity material such as graphite may be used as the material of inner shield 2. However, the inner shield is not limited to this material. As an example, carbon composite material, which has a higher strength, may be used.

The single-crystal manufacturing apparatus including an inner shield 2 having such a structure reduces the heat transfer area from the inner shield 2 to the supporting member 3 so that the heat transfer from the inner shield 2 to the supporting member 3 can be inhibited and the heat retaining property in its furnace structure can be improved. As a result, the single-crystal manufacturing apparatus can save electric power and thereby reduce the manufacturing cost of the single crystal. The single-crystal manufacturing apparatus can also reduce the raw material melting time, thereby reducing the single-crystal manufacturing time and damage to the quartz crucible. In addition, the material used for a contact portion between the inner shield 2 and the supporting member 3 is reduced so that the cost of the single-crystal manufacturing apparatus itself can be reduced.

In this case, insofar as it has enough strength to support the inner shield 2, the heat transfer area from the inner shield 2 to the supporting member 3 is preferably as small as possible, because the heat transfer from the inner shield 2 to the supporting member 3 can be inhibited more. To this end, the number of the three or more supporting points may be appropriately adjusted according to the material, size, shape, and the like of the inner shield 2 and supporting member 3.

As shown in FIG. 2, the inner shield 2 may contact the supporting member 3 through the rod-shaped members 21. For example, the rod-shaped members 21 can be disposed in a manner that extends radially outward from the inner shield 2. In this structure, the heat transfer from the inner shield 2 to the supporting member 3 is dominantly affected by the cross-sectional areas of the rod-shaped members 21. Therefore, reducing the sum of cross-sectional areas of the rod-shaped members 21 can ensure a small heat transfer area. Here, the rod-shaped members 21 may be either prismatic or cylindrical. As described above, the material, size, shape, and number of the rod-shaped members 21 may be appropriately determined so as to ensure enough strength to support the inner shield 2. As an example, carbon material or carbon composite material can be used as the material of the rod-shaped members. The rod-shaped members 21 made of carbon material or carbon composite material is preferably used because the strength at supporting points at which the inner shield 2 is supported can be sufficiently enhanced, and the cross-sectional areas of the rod-shaped members 21 can be designed to be smaller.

Moreover, the sum of the cross-sectional areas of the three or more rod-shaped members 21 is preferably 200 $cm^2$ or less. The number, length, and width of the rod-shaped members 21 can be adjusted for such a total cross-sectional area. When the sum of cross-sectional areas of the three or more rod-shaped members 21 is 200 $cm^2$ or less, the heat transfer area from the inner shield 2 to the supporting member 3 can be sufficiently reduced, and the heat transfer from the inner shield to the supporting member 3 can be inhibited more surely.

The rod-shaped members 21 can be each fixed such that both its ends are attached to the lower end of the inner shield 2 and the upper end of the supporting member 3 respectively. Alternatively, the rod-shaped members 21 can be configured such that its one end alone is fixed to the lower end of the inner shield 2 and the other end is placed on the upper end of the supporting member 3 without being fixed, or its one end alone is fixed to the upper end of the supporting member 3 and the inner shield 2 is placed on the other end without fixing to the inner shield 2. This configuration enables fixing cost reduction and easy maintenance, for example, when the inner shield 2 alone is exchanged.

In this cases, the inner shield 2 and the rod-shaped members 21 fixed to the inner shield may move horizontally on the supporting member 3. When the amount of the movement is small, however, there arises no problem. Accordingly, to reduce the movement amount, the rod-shaped members 21 are desirably processed to add the limitation of its movement. For example, as shown in FIG. 3, the step (See 'B' in FIG. 3)

that forms the narrow end portion can be formed on the rod-shaped member 21, and the narrow end portion can be placed on the supporting member 3. The three or more rod-shaped members 21 can be attached with them equally spaced on the outer circumference of the lower end of the inner shield 2.

Figure 3:
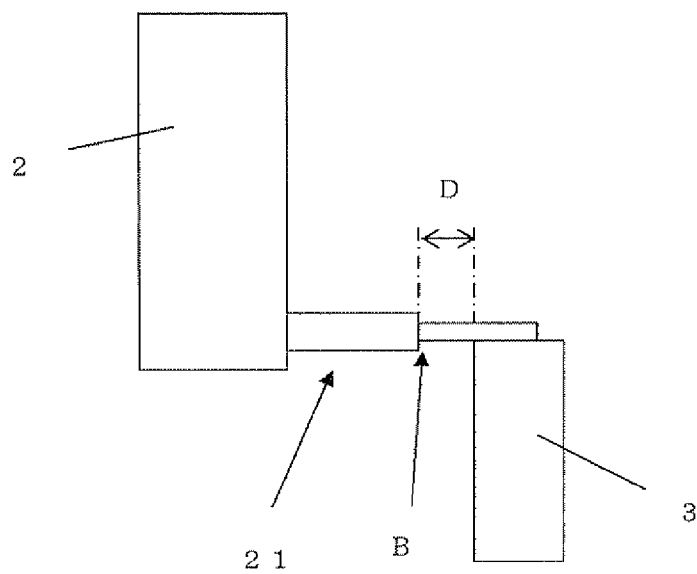
FIG. 3 is a schematic view showing an exemplary rod-shaped member in the single-crystal manufacturing apparatus of the present invention.

This rod-shaped member 21 can limit the movement amount on the supporting member 3 within the range of a clearance D shown in FIG. 3 by the step. For example, electric discharge that may be caused by the reduction in the distance between the inner shield 2 and the heater 11 can be consequently avoided by adjusting the clearance D so that the inner shield and heater can be prevented from being damaged and manufacturing operation can be prevented from being obstructed. In addition, even when the diameter precision of the inner shield 2 is low, the adjustment of the clearance D enables positional variations due to the movement to be limited within a constant range.

Figure 4:
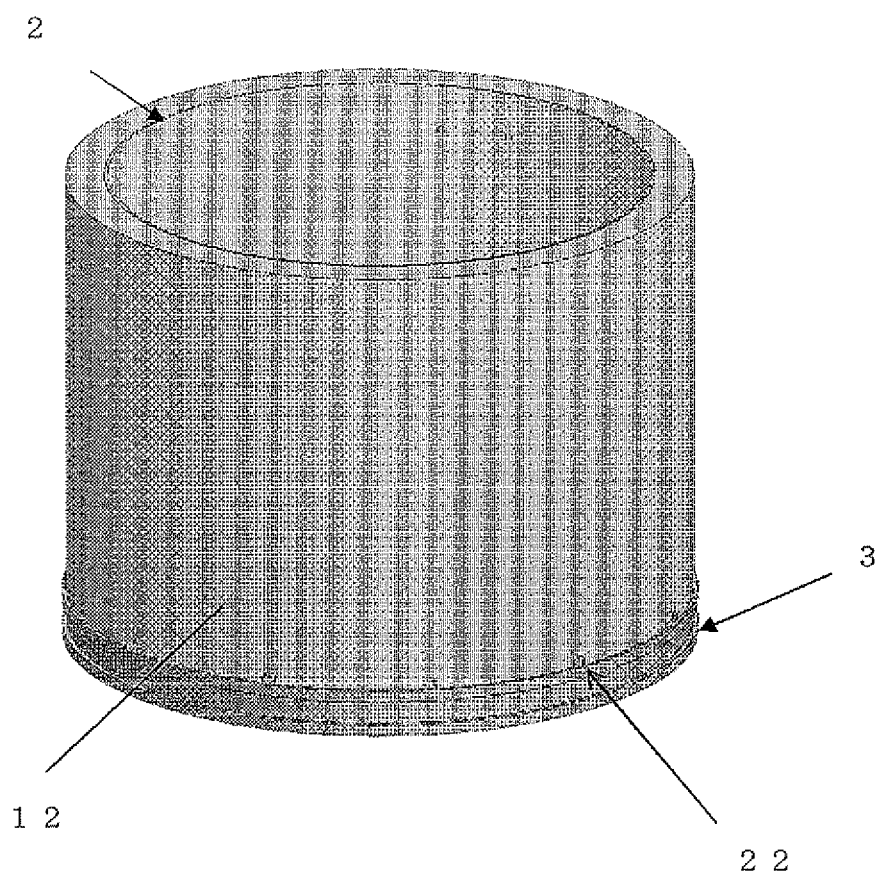
FIG. 4 is a schematic view showing an example of the inner shield and supporting member in the single-crystal manufacturing apparatus of the present invention.

As shown in FIG. 4, the heat insulator 12 can be provided so as to surround the inner shield 2. In this case, when the inner shield 2 contacts the supporting member 3 through the rod-shaped members 21, the heat insulator 12 can be provided such that concave portions or holes 22 formed on the heat insulator 12 are engaged with the rod-shaped members 21 fixed to the inner shield 2 or the rod-shaped members 21 fixed to or placed on the supporting member 3 and the inner shield 2 is covered with the heat insulator 12.

When the heat insulator 12 is provided so as to surround the inner shield 2, the heat retaining property and the electric power saving effect can be further improved. Since the lower end of the inner shield 2 of the single-crystal manufacturing apparatus of the present invention partially does not contact the supporting member 3, the non-contact portion can be also covered with the heat insulator 12. The lower end of the inner shield 2 can be further covered with the heat insulator 12, and electric power can be thereby more effectively saved by the heat insulator 12 as compared with the conventional single-crystal manufacturing apparatus in which the entire lower end surface of the inner shield 2 contacts the supporting member 3.

As shown in FIG. 1, the single-crystal manufacturing apparatus can include a magnetic field applying device 23 constituted of, for example, a permanent magnet or an electromagnet, for applying a magnetic field to the raw material melt 6. The single-crystal manufacturing apparatus including the magnetic field applying device 23 for applying a magnetic field to the raw material melt 6 can prevent generation of dislocation of the single crystal 8 being manufactured by controlling convection in the raw material melt 6. This single-crystal manufacturing apparatus can also control impurity concentration more precisely.

Next, the single-crystal manufacturing method of the present invention will be described. In the single-crystal manufacturing method of the present invention, a single crystal is manufactured with the above-described single-crystal manufacturing apparatus of the present invention. Here, the case in which the single-crystal manufacturing apparatus of the present invention shown in FIG. 1 is used will be described.

As shown in FIG. 1, first, a polycrystalline silicon raw material with high purity is heated to a temperature equal to or more than the melting point (approximately 1420° C.) in the crucibles 9 and 10 and melted to obtain the raw material melt 6. Then, the end of the seed crystal 13 is brought into contact with or dipped into the melt surface at substantially center part thereof by reeling off the wire 15.

In this case, in order to eliminate dislocations generated when the seed crystal 13 is brought into contact with the raw material melt 6, the crystal is once made thin to a diameter of approximately 3 to 5 mm in an early stage of the growth, and the diameter is increased up to a desired diameter after the dislocations are eliminated so as to grow a single crystal 8 having an aimed diameter and quality. Alternatively, without performing a necking process as described above, the single crystal 8 can be grown by using the dislocation-free seeding method in which a seed crystal 13 having a pointed tip is used, the seed crystal 13 is gently brought into contact with the raw material melt 6 to dip the seed crystal up to a predetermined diameter, and the seed crystal is then pulled.

Thereafter, while the crucible rotating shaft 18 is rotated in a proper direction, the wire 15 is wound up with being rotated to pull the seed crystal 13, and the single crystal 8 is thereby started to grow. The single crystal 8 is pulled while the pulling rate of the single crystal 8 and the power of the heater 11 are controlled to obtain a desired diameter and quality.

When the single crystal is manufactured with the single-crystal manufacturing method of the present invention as described above, the single crystal can be manufactured with a high heat retaining property, and the manufacturing time can be therefore reduced by the reduction in the raw material melting time. The manufacturing cost can also be reduced by the power consumption reduction during single-crystal manufacturing.

EXAMPLE

The present invention will be more specifically described below with reference to Example and Comparative Example, but the present invention is not limited these examples.

Example

With the single-crystal manufacturing apparatus of the present invention shown in FIG. 1, a silicon single crystal having a diameter of 300 mm was manufactured. The inner shield contacting the supporting member through the rod-shaped members as shown in FIG. 2 was used. With a rod-shaped member having a 24-mm diameter cylindrical body and a step forming a 16-mm diameter narrow end portion as shown in FIG. 3, 12 rod-shaped members were fixed with equally spaced to the lower end of the inner shield in total. The narrow end portions of the rod-shaped members were placed on the supporting member. The contact area between the inner shield and the supporting member was 54 cm$^2$, which corresponds to approximately 10% of that of an inner shield in which its entire surface contacts the supporting member. The inner shield and rod-shaped members used herein were made of carbon composite material. The heat insulator provided so that the inner shield was covered with the heat insulator as shown in FIG. 4 was used.

First, a polycrystalline silicon raw material of 500 kg was charged into a quartz crucible having a diameter of 91 cm and melted. A horizontal magnetic field was applied at a center intensity of 0.4 T with the magnetic field applying device. Through a process for maturing the raw material melt, a seed crystal having an orientation of <100> was dipped into the raw material melt. At this time, Ar was introduced from the gas inlet at a rate of 200 L/min. The pressure in the single-crystal manufacturing apparatus was adjusted to 75 Torr (approximately 10 KPa) by resistance provided in its exhaust pipe.

The diameter of the single crystal was increased to 300 mm by the dislocation-free seeding method. Boron was doped to adjust the specific resistance of a straight body portion, which will be product, to 10Ω·cm and the 300-mm diameter, boron-doped silicon single crystal was pulled.

During the pulling, the power consumption of the single-crystal manufacturing apparatus and the raw material melting time were measured. As a result, both were reduced by approximately 5% in comparison with the result of the later-described Comparative Example.

As described above, it was confirmed that the single-crystal manufacturing apparatus and method of the present invention can improve the heat retaining property in the furnace structure and save electric power by inhibiting the heat transfer from the inner shield to the supporting member and can reduce single-crystal manufacturing time by the reduction in the raw material melting time.

Comparative Example

Figure 5:
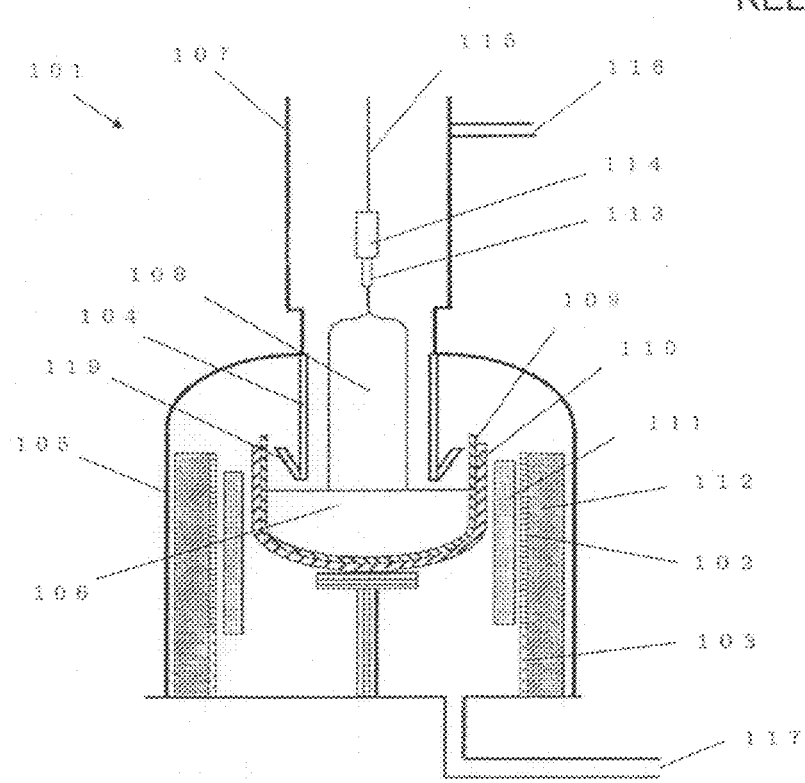
FIG. 5 is a schematic view showing the conventional single-crystal manufacturing apparatus.
Figure 6:
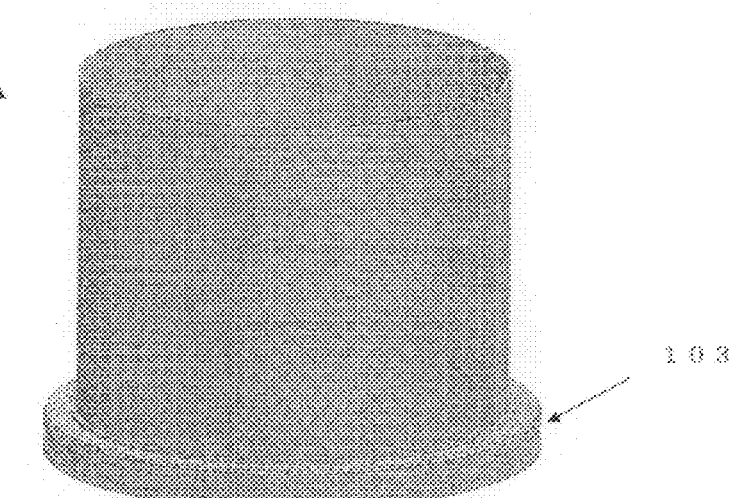
FIG. 6 is a schematic view showing a conventional inner shield in the conventional single-crystal manufacturing apparatus.

A silicon single crystal was manufactured in the same conditions as Example except for using the conventional single-crystal manufacturing apparatus shown in FIG. 5, having an inner shield with its entire lower end surface contacting the supporting member as shown in FIG. 6. As with Example, the power consumption of the single-crystal manufacturing apparatus and the raw material melting time were evaluated.

As a result, the power consumption and the melting time were both increased by approximately 5% in comparison with Example.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A single-crystal manufacturing apparatus according to the Czochralski method, comprising:
   a crucible that contains a raw material;
   a main chamber that accommodates a heater for heating and melting the raw material;
   a pulling chamber configured to pull and accommodate a grown single crystal, the pulling chamber continuously provided above the main chamber;
   an inner shield for insulating heat radiated from the heater, the inner shield provided between the heater and the main chamber; and
   a supporting member for supporting the inner shield from below, wherein:
   the inner shield is supported at three or more supporting points contacting the supporting member,
   a lower end of the inner shield except at the supporting points does not contact the supporting member,
   the inner shield has a portion that does not contact the supporting member at the lower end of the inner shield, and
   the supporting member has a portion that does not contact the inner shield at an upper end of the supporting member.

2. The single-crystal manufacturing apparatus according to claim 1, wherein the inner shield contacts the supporting member through rod-shaped members, and a sum of cross-sectional areas of the rod-shaped members is 200 cm$^2$ or less.

3. The single-crystal manufacturing apparatus according to claim 2, wherein the rod-shaped members are made of carbon material or carbon composite material.

4. The single-crystal manufacturing apparatus according to claim 2, wherein the rod-shaped members each have a step that forms a narrow end portion, and the narrow end portions are placed on the supporting member.

5. The single-crystal manufacturing apparatus according to claim 3, wherein the rod-shaped members each have a step that forms a narrow end portion, and the narrow end portions are placed on the supporting member.

6. The single-crystal manufacturing apparatus according to claim 1, further comprising a heat insulator surrounding the inner shield.

7. The single-crystal manufacturing apparatus according to claim 2, further comprising a heat insulator surrounding the inner shield.

8. The single-crystal manufacturing apparatus according to claim 3, further comprising a heat insulator surrounding the inner shield.

9. The single-crystal manufacturing apparatus according to claim 4, further comprising a heat insulator surrounding the inner shield.

10. The single-crystal manufacturing apparatus according to claim 5, further comprising a heat insulator surrounding the inner shield.

* * * * *